United States Patent [19]

Thomas et al.

[11] 4,283,260
[45] Aug. 11, 1981

[54] METHOD AND SYSTEM FOR REGULATING THE DISCHARGE PROCESS IN A CATHODE SPUTTERING APPARATUS

[75] Inventors: Friedrich W. Thomas, Hasselroth; Konrad Priess, Hahl am Main, both of Fed. Rep. of Germany

[73] Assignee: Leybold-Heraeus, Cologne, Fed. Rep. of Germany

[21] Appl. No.: 35,363

[22] Filed: May 2, 1979

[30] Foreign Application Priority Data

May 13, 1978 [DE] Fed. Rep. of Germany ....... 2821119

[51] Int. Cl.³ .............................................. C23C 15/00
[52] U.S. Cl. .................................. 204/192 R; 204/298
[58] Field of Search ............................ 204/192 R, 298

[56] References Cited

U.S. PATENT DOCUMENTS

| | | | |
|---|---|---|---|
| 4,024,291 | 5/1977 | Wilmanns | 427/10 |
| 4,043,889 | 8/1977 | Kochel | 204/192 R |
| 4,113,599 | 9/1978 | Gillery | 204/192 P |
| 4,124,474 | 11/1978 | Bomehil et al. | 204/192 R |
| 4,201,645 | 5/1980 | Riegert | 204/192 R |

Primary Examiner—Delbert E. Gantz
Assistant Examiner—William Leader

[57] ABSTRACT

The invention relates to a method and a circuit for the regulation of the discharge process in a cathode sputtering apparatus equipped with current, voltage and pressure regulators for controlling the sputtering process. A temperature rise in the discharge area in the course of operation is unavoidable, and, if constant pressure were maintained, this would result in a reduction of the charge carrier density and hence in a reduction of the discharge current, resulting simultaneously in a change in the rate of deposition. The invention resides in regulating to a programmed or constant value, not the pressure but the discharge current, doing so by varying the pressure within certain limits. For this purpose, while the sputtering voltage is maintained constant, a current reference level is given with which the actual current of the discharge is compared. Any current deviations are used for the purpose of operating the pressure regulator such that the current is maintained constant in the discharge area. This can be accomplished in an especially simple manner by operating the metering valve for the feeding of the sputtering gas in a current-related manner.

7 Claims, 1 Drawing Figure

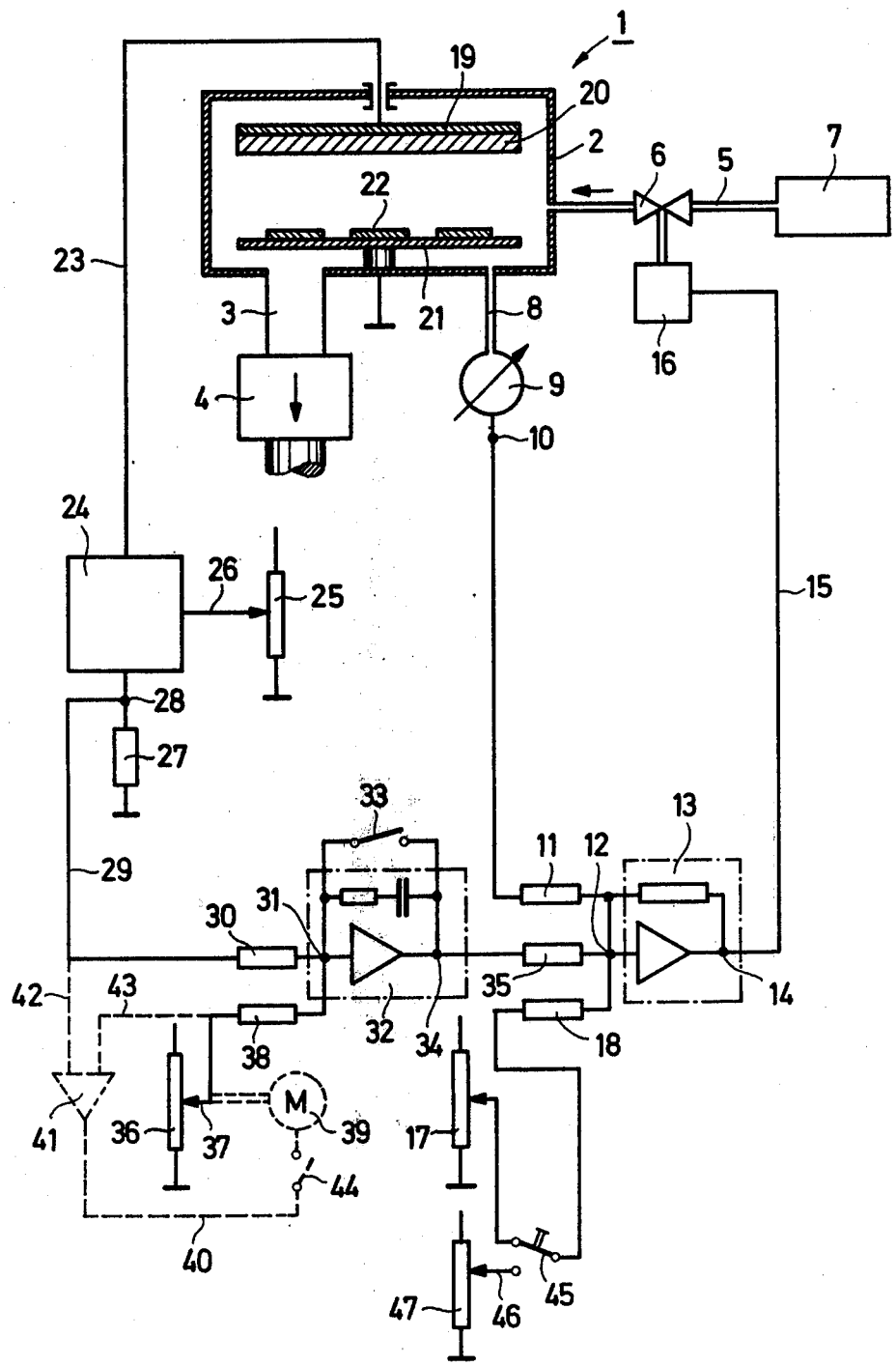

METHOD AND SYSTEM FOR REGULATING THE DISCHARGE PROCESS IN A CATHODE SPUTTERING APPARATUS

BACKGROUND

The invention relates to a method for the regulation of the discharge process in a cathode sputtering apparatus which is equipped with current, voltage and pressure regulators for controlling the sputtering process.

In the sputtering of target materials and in the deposition of the sputtered material on substrates, three parameters of decisive importance have a direct influence on the discharge process, that is, the electrical conditions prevailing between cathode and substrate, namely, the voltage, the current and the pressure of the gas present in the discharge zone. This is true with regard to both high-frequency and direct-current sputtering. During the discharge or sputtering process, both the sputtering gas and the parts of the apparatus in the area where the discharge takes place become heated, a fact which is systematically exploited in the glow-discharge treatment of materials, for the purpose of producing high temperatures. In the case of cathode sputtering for the production of thin films, this heating is essentially undesirable, but unavoidable due to the laws of physics.

The cathode sputtering apparatus known hitherto are generally equipped with pressure regulators which are intended for the purpose of keeping the process pressure constant despite the influence of other process parameters. For this purpose, the known apparatus have a pressure sensor whose output is an electrical signal proportional to the pressure, which is delivered together with a reference level signal to the input of the pressure regulator. The output of the pressure regulator is connected to the actuator of a metering valve which is disposed in the gas feed line to the cathode sputtering apparatus. Since gas is continuously being pumped out of the apparatus by vacuum pumps during the cathode sputtering process, it is possible by regulating the gas feed to bring about a state of equilibrium in the apparatus. The gases involved are noble gases, preferably argon, and also noble gases mixed with appropriate reactive gases, such as oxygen, for example, in the case of reactive sputtering. The usual sputtering pressure is on the order of $10^{-2}$ millibars.

In the known cathode sputtering apparatus, furthermore, the discharge current is maintained constant by varying the sputtering voltage accordingly. The sputtering voltage is consequently subject to fluctuations which are necessary for the maintenance of a constant sputtering current. The sputtering power, i.e., the product of current and voltage, is consequently likewise subject to corresponding variations. As stated above, the parts exposed to the plasma and the plasma itself become increasingly hotter during long sputtering operations. In the sealed vacuum chamber, in accordance with the equation of state for gases, the result would be that, as the temperature increases, so does the pressure. Since, however, the pressure is regulated so as to be constant, this means that, as the temperature increases, the weight of the gas in the vacuum diminishes, so that increasingly fewer charge carriers are present in the vacuum chamber. From the electrical viewpoint, the system becomes increasingly resistant, while the current regulator is attempting to keep the discharge current constant by adjusting the voltage. This process reaches its limit at the end of the voltage control range while the discharge power also changes continually.

However, to maintain a uniform build-up of the film, it is highly desirable to maintain a constant discharge or sputtering power throughout the entire sputtering process.

THE INVENTION

It is the object of the invention to devise a regulating method and a regulating system whereby it will be possible to keep the discharge power substantially constant even over long periods of time and thereby to assure a uniform build-up of the film.

The achievement of this stated object is accomplished in the above-described method in accordance with the invention by the fact that the voltage is kept substantially constant, that the prevailing discharge current is compared with a reference current and the difference together with the prevailing pressure value is delivered to the pressure regulator such that the sputtering pressure, in the event of any deviation of the discharge current, will be corrected to such a value that the discharge current will substantially correspond to the reference current.

The method of the invention therefore constitutes a departure from the former method of keeping the sputtering pressure substantially constant. The deliberate variation of the sputtering pressure that is performed by the pressure regulator in accordance with the invention brings it about that the electrical resistance of the discharge part of the circuit is kept substantially constant, so that the resultant coordination of current and voltage and hence the discharge power are maintained at predetermined levels. This results in extremely uniform films even during relatively long sputtering periods. Experience has shown that, for the maintenance of a constant current at likewise constant voltage, relatively slight pressure changes are required, which have no harmful effect on the build-up of the film. The necessary pressure changes produce deflections of the indicator of ordinary meters amounting to the order of magnitude of the width of the indicator, i.e., they are negligible. This is to be attributed to the "steep" relationship between the current and the pressure.

The expressions, *current regulator* and *current regulation*, as used herein, are to be understood indirectly, i.e., the output of the current regulator does not act—as formerly—directly on the power supply system, but on the input of the pressure regulator, which is appropriately modulated by the current-related signal, so that the current regulation is what is known as "indirect current regulation."

An indirect current regulation could also be accomplished by omitting the pressure sensor or actual pressure signaling means and connecting the output of the current regulator directly to the actuator of the metering valve. Experience, however, has shown that such regulation involves an oscillation build-up which is difficult to control, while the operation of the pressure regulator in accordance with the invention results in a virtually oscillation-free regulation, even in the event of abrupt changes of the various control levels. The method of the invention makes it possible even for less skilled personnel to operate a cathode sputtering apparatus, i.e., even a very faulty adjustment of the current and pressure reference levels is largely compensated by the method of the invention.

The invention furthermore relates to a system for the regulation of the discharge process in a cathode sputtering apparatus, consisting of a vacuum chamber having a cathode and at least one counterelectrode, of a pressure regulator having a pressure sensor and a control for the rate of input of the sputtering gas, of a voltage regulator, and of a current regulator having a current sensor, each of them having corresponding signal inputs and outputs.

Such a system is characterized in accordance with the further invention in that the output of the current regulator together with the output of the pressure sensor are connected additively such that a lowering of the prevailing pressure and a lowering of the prevailing current will act in the same sense towards a pressure increase.

Of course, this action also takes place in the opposite direction, i.e., an increase in the prevailing pressure and an increase in the prevailing current will act in the same sense towards a reduction of pressure. Since a lowering of the prevailing current, however, on account of the heating actions explained above, is the main effect that occurs, the manner of operation of the regulating circuit and the resulting interpretive data will be defined on the basis of what takes place when the pressure and current decrease.

The subject of the invention is in principle a cascade connection of current and pressure regulators, which can also be referred to as a "packaged" regulating system. The design is best so arranged that the influence of the current regulator dominates (master control), while the influence of the pressure regulator is subordinate ("slave control"), as soon as the current regulator has entered into operation or has been turned on, as the case may be. The design data arising out of this, however, are relatively easy for the control technician to determine, so that there is no need to provide further information.

In principle, the pressure control could also be brought about by having the actuator which controls the input of sputtering gas modulate the power of the vacuum pumps. It is, however, especially simple and advantageous for the output of the pressure regulator to be delivered to an actuator operating a metering valve in the gas supply line. In this manner the gas consumption can be reduced to a minimum.

The system of the invention can be further perfected by additionally connecting to the input of the current regulator a reference value generator, which is additionally constructed as a motor-driven potentiometer and can be actuated such that the prevailing current will be made to equal the reference current for the purpose of smooth switchover to the pressure regulator. As a result, after the change-over from ignition of the discharge to steady operation, no more than insignificant pressure variations occur. If the reference pressure level should have to be changed again, the control is changed back from current control to pressure control, and when the new desired actual pressure is reached, the system is again smoothly changed back to current control.

BRIEF DESCRIPTION OF THE DRAWING

An embodiment of the invention and its manner of operation will now be explained with the aid of the drawing showing a vertical cross sectional view of a cathode sputtering apparatus and the regulating system of the invention.

DETAILED DESCRIPTION OF THE INVENTION

The essential element of the cathode sputtering system 1 is a vacuum chamber 2, which can be evacuated through a tube 3 and a vacuum pump 4. To the vacuum chamber 2 there is connected, through a gas supply line 5 and a metering valve 6 disposed therein, a gas source 7 containing, for example, argon under pressure.

The vacuum chamber 2 is furthermore connected by a tube 8 to the pressure sensor 9 which is simultaneously a measuring and indicating apparatus and converts the pressure to a proportional electrical signal appearing at the output 10. The output 10 is connected by a resistance 11 to the input 12 of a pressure regulator 13 whose output 14 is connected by a line 15 to the actuator 16 of the metering valve 6. The control circuit containing the pressure regulator 13, as described thus far, has the effect, without external influence, of keeping constant the pressure in the vacuum chamber 2, despite the influence of the amounts of gas fed in through gas line 5 and out through tube 3. A reference pressure value is established at the input 12 of the pressure regulator by means of a potentiometer 17 and a resistance 18.

Within the vacuum chamber 2 there is a cathode 19 having a metallic or dielectric target 20, and a counterelectrode 21 in the form of a substrate holder bearing a plurality of substrates 22. The counterelectrode together with the vacuum chamber 2 is grounded, while the cathode 19 is suspended in an insulated manner and connected by a line 23 to a power supply 24, which can be a high-frequency generator or a direct-current source. The voltage, which is to be kept constant throughout the sputtering process, is established by a potentiometer 25 having the wiper 26. Between the cathode 19 and the counterelectrode 21 is the discharge gap through which the discharge current flows, which is supplied through the line 23. A current proportional to this current also flows through a shunt 27; its magnitude can be detected by a current detector 28. The current detector is connected by a line 29 and a resistance 30 to the input 31 of a current regulator 32 which can be taken out of operation by a switch 33. The current regulator 32 has an output 34 which is delivered through a resistance 35 to the input 12 of the pressure regulator 13. The current regulator 32 is best in the form of a PI regulator. A potentiometer 36, whose wiper is connected by a resistance 38 to the input 31 of the current regulator 32 serves for the establishment of a current reference level.

The part of the system described thus far operates in the following manner: First a sputtering voltage is established by means of the power supply 24 and the potentiometer 25, and is maintained constant by a regulating system which is not further indicated. A corresponding current is preset at the potentiometer 36; the switch 33 is at first still closed, so that the current regulator 32 is out of operation. By means of the pressure regulator 13, a pressure is built up in the vacuum chamber 2, which at least at the beginning is high enough to assure the start of the discharge. This pressure is adjusted at the potentiometer 17, and initially it is maintained constant by means of the pressure regulating circuit. By the opening of switch 33, the current regulator 32 is now activated and master-controls the pressure regulator 13. The rising temperature of the content of the vacuum chamber 2 causes the gas contained therein to expand, thereby reducing the number of charge carriers per unit of volume. This expresses itself first in a slight reduction of the discharge current, which without the intervention of the current regulator 32 would continue as the temperature increases. The beginning of the current reduction, however, is detected by the current detector 28 and transmitted to the current regulator 32, which will influence the pressure regulator 13 in the same sense as a pressure drop which would be measured by the pressure sensor 9, i.e., the metering valve will be opened further by the actuator 16, so that the pressure in vacuum chamber 2 will increase. Thus, the number of charge carriers per unit of volume will again be increased and the original discharge current will be restored, aside from a very slight control latitude.

Between the potentiometer 17 and the resistance 18 an ignition pushbutton switch 45 can be provided, upon whose actuation the input of the resistance 18 is briefly connected to the wiper 46 of a potentiometer 47 which is preset so as to produce a pressure value at which the ignition of the discharge will reliably take place. After the ignition switch is released, the reference pressure is restored which corresponds to the setting of the potentiometer 17.

Whereas the part of the regulating system described thus far has three manually adjusted potentiometers 17, 25 and 36, operation can be further simplified by the systems and circuitry represented in broken lines. For this purpose the potentiometer 36 or its wiper 37 is driven by a motor 39 so as to constitute a motorized potentiometer. The motor 39 receives its controlling signals through a conductor 40 which is connected to the output of a potentiometer controller 41. The inputs of the controller 41 are connected by a conductor 42 to the conductor 29 and by a conductor 43 to the resistor 38. As soon as a switch 44 is closed, the motor 39 moves the wiper 37 until the voltage difference at both inputs of controller 41 and hence at the input 31 of regulator 32 becomes zero, i.e., no signal appears at the output 34 of the current regulator 32. In this manner a smooth connecting of the current regulator 32 can be achieved. Thereupon, the switch 44 is reopened, and, due to the steep relationship between the discharge current and the pressure, no more than insignificant pressure fluctuations on the order of the width of the indicator will be produced after changeover to current control. In the case last described, the desired sputtering pressure can be established from the outset at potentiometer 17.

Automatic ignition without a separate ignition switch and without an ignition pressure reference value can be brought about through the current control as follows. When the sputtering voltage is turned on, the current regulator 32 is activated by the opening of the switch 33. The sputtering current reference value is established through the potentiometer 36. If the momentary gas pressure in the vacuum chamber should be too low for the discharge current to flow, the current regulator deviation will cause the next following pressure regulator 13 to open the control valve 16 until the charge carrier concentration required to start the flow of current (ignition) is established on the basis of the resultant pressure rise. After the current start, the current regulator regulates the discharge current to the predetermined reference level in accordance with its PI characteristic.

What is claimed is:

1. In a cathode sputtering process, a method for regulating the discharge current, comprising: providing a vacuum chamber with a cathode and at least one counterelectrode therein; initially establishing a substantially constant sputtering pressure in the vacuum chamber; establishing and maintaining a substantially constant sputtering voltage; sensing the actual discharge current across the electrodes; comparing the actual discharge current with a desired reference current value to obtain a difference value if any; sensing the actual sputtering pressure in the chamber; comparing the actual sputtering pressure with a desired reference pressure value to obtain a difference value if any, and adjusting the sputtering pressure from its initial level in response to a deviation of the discharge current from the reference current value and in response to a deviation of the sputtering pressure from the reference pressure value to effect a desired change in the sputtering pressure, whereby the discharge current is stabilized.

2. The method according to claim 1 wherein the constant sputtering pressure which is initially maintained is sufficient to start the discharge and is maintained solely by the sensing of the actual sputtering pressure, the sputtering voltage is maintained solely by sensing the actual sputtering voltage and the discharge current is maintained at the constant value after the constant sputtering voltage and constant sputtering pressure are established and thereafter, the sputtering pressure is controlled both in response to changes in the discharge current from the reference current value and to changes sensed in the actual sputtering pressure.

3. The method according to claim 1, wherein the step of adjusting the sputtering pressure comprises feeding gas to the vacuum chamber through a single controllable metering valve and controlling the metering valve by the difference value.

4. In a cathode sputtering apparatus having a vacuum with a cathode and at least one counterelectrode therein, a system for regulating the discharge current comprising: sputtering pressure regulating means including a pressure regulator having a control signal input to effect control of the throughput of sputtering gas and a pressure sensor for sensing the sputtering pressure and generating an output signal representative of the sputtering pressure and for applying the output signal to the input of the pressure regulator; and discharge current regulating means including means for sensing the actual discharge current and comparing same to a reference value for developing an output signal representative of the deviation of the actual discharge current from the reference current value and means for applying the output signal of the comparing means together with the output signal of the pressure sensor to the input of the pressure regulator to effect a desired change in the sputtering pressure, whereby stabilization of the discharge current is obtained.

5. The system according to claim 4, wherein the pressure regulating means further includes a gas feedline and a single actuatable metering valve in the gas feedline and wherein the output of the pressure regulator actuates the metering valve.

6. The system according to claim 3, wherein the means for applying the output signals includes switching means for first effecting a regulation of the sputtering pressure without the output signal of the comparing means and thereafter with both output signals.

7. The system according to claim 5, wherein the switching means includes a motorized potentiometer for effecting a smooth switchover in the control of the pressure regulator from the single signal input to the dual signal input.

* * * * *